United States Patent [19]

Acovic et al.

[11] Patent Number: 5,315,142
[45] Date of Patent: May 24, 1994

[54] HIGH PERFORMANCE TRENCH EEPROM CELL

[75] Inventors: Alexandre Acovic, Yorktown Heights, N.Y.; Ching-Hsiang Hsu, Hsin Chu, Taiwan; Being S. Wu, Yorktown Heights, N.Y.

[73] Assignee: International Business Machines Corporation, Armonk, N.Y.

[21] Appl. No.: 855,956

[22] Filed: Mar. 23, 1992

[51] Int. Cl.$^5$ ............................................. H01L 29/78
[52] U.S. Cl. ................................. 257/316; 257/321; 257/513
[58] Field of Search ........................ 257/316, 321, 513

[56] References Cited

U.S. PATENT DOCUMENTS

| | | | |
|---|---|---|---|
| 4,456,978 | 6/1984 | Morley et al. | 365/184 |
| 4,796,228 | 1/1989 | Baglee | 365/185 |
| 4,814,840 | 3/1989 | Kameda | 257/316 |
| 4,929,988 | 5/1990 | Yoshikawa | 257/316 |
| 4,964,080 | 10/1990 | Tzeng | 365/185 |
| 4,975,384 | 12/1990 | Baglee | 437/43 |
| 4,979,004 | 12/1990 | Esquivel et al. | 257/316 |
| 4,990,979 | 2/1991 | Otto | 257/321 |

Primary Examiner—Robert Limanek
Attorney, Agent, or Firm—Blaney Harper; David Aker

[57] ABSTRACT

The objects of the present invention are accomplished by merging a MOSFET device and a floating gate into a three dimensional trench structure. The trench device cell has four vertical sides and bottom. The bottom of the trench forms the channel region of the transfer FET of the EEPROM cell. The heavily doped source and drain regions are formed on two vertical sidewalls of the trench and oppositely face each other. The heavily doped regions cover the entire sidewall and have a depth which is greater than the trench depth so that the channel region is defined by the bottom of the trench. The remaining two vertical sidewalls of the trench are formed by isolation oxide. A first silicon dioxide layer covers the bottom of the trench and forms part of the gate oxide of the cell device. A second silicon dioxide layer covers the vertical sidewalls of the trench. The second silicon dioxide layer is relatively thin with respect to the gate oxide layer. The second silicon dioxide layer separates the source and drain regions from the floating gate which overlays both the first and second silicon dioxide layers. The floating gate overlaps all four trench sidewalls and substantially increases the coupling between the floating-gate and the control-gate. A control gate overlies the floating gate and the control gate is separated from the floating gate by a separate dielectric layer. The second silicon dioxide layer is relatively thin so that tunneling of electrons between the vertical sidewalls which incorporate the source and drain regions and the floating gate will occur. Tunnelling is the mechanism which charges and discharges the floating gate. The trench EEPROM memory structure of the present invention occupies a small amount of surface area while maintaining a high coupling ratio between the control gate and the floating gate. The high coupling ratio between the floating-gate and the control-gate is maintained because the floating gate is butted to isolation oxide on two sides of the trench. The trench EEPROM memory structure of the present invention also reduces program and erase time because the floating gate can be programmed or charged through either the source or drain regions in many cells at one time.

12 Claims, 9 Drawing Sheets

HIGH PERFORMANCE TRENCH EEPROM CELL

FIELD OF THE INVENTION

This invention relates generally to the field of semiconductor devices. In particular, this invention relates to a semiconductor memory device. More specifically, this invention relates to an electrically erasable programmable read only memory device.

BACKGROUND OF THE INVENTION

A nonvolatile memory maintains stored data even though the memory does not have power for a period of time. A read only memory is a memory which contains data that can not change. Nonvolatile read only memories are very useful in computers because they provide a computer with initial instructions or data when the computer is first powered up. These memories are useful, however, the entire memory must be discarded when the initial instruction set or data is changed. Nonvolatile programmable read only memories (PROMS) are memories in which the stored instructions or data can be changed without discarding the entire memory. Typically, changing the instructions or data in a PROM required erasing the existing data with ultraviolet light and electrically reprogramming the device. This is a time consuming and difficult process and it is impractical to erase and reprogram such a device frequently. However, PROMs which are both electrically erasable and programmable are practical to erase and reprogram and, as a result, are very useful in computers or electrical devices where power is frequently interrupted. This is because the data and instructions the computer was processing can be stored when the power is interrupted and recalled when power is restored.

Electrically erasable programmable read only memories (EEPROMs) were developed in response to the need for a nonvolatile memory which could have the stored data changed on a frequent basis. FIG. 1 illustrates a prior art EEPROM cell. The EEPROM cell is a conventional FET comprised of a source, drain, and gate regions wherein the gate region has been modified to include a floating gate. The EEPROM memory is composed of an array of EEPROM cells identical to the cell of FIG. 1. The array is organized into columns of devices connected to individual bit lines and rows of devices connected to individual word lines. Each cell is addressed by energizing the bit lines (B/L) 18 and 18' and the word line (W/L) 20 attached to a particular memory cell in the array. The W/L 20 forms a control gate 10 over each cell in the array. The control gate 10 covers a first insulator layer 8 which covers a floating gate 6 which covers the channel region 4 of the cell device. The bit lines 18 and 18' are connected to the drain 16 and source 14 respectively of the cell device. The drain 16 and the source 14 are both typically an n-type regions (but can be p-type regions).

The EEPROM device is programmed by applying a large positive voltage to the W/L 20 and B/L 18 (connected to drain 16) with respect to the voltage on the p-type substrate 2 and on the source 18'. The large voltage on the B/L 18 increases the energy of electrons in the channel region 4 close to the drain region 16. The large voltage on the control gate induces an electric field which moves the highly energetic electrons from the channel region 4 close to the drain into the floating gate 6. The presence of the electrons in the floating gate 6 alters the normal operation of the FET. Normally, a low level voltage on the gate of the FET would provide a conductive path between the drain and source regions. However, when the device has been programmed with electrons in the floating gate, the low level voltage on the control gate is not sufficient to provide the conductive path between the drain and source regions. Detecting when current flows between the drain and source regions when a low voltage is applied to the control gate 10 (through W/L 20) and B/L 18 with respect to B/L 18' indicates the state of data stored in the EEPROM cell. The floating gate 6 is erased by applying a large positive voltage on the wordline with respect to the substrate 2 (independent of the voltage on the bit line). This large voltage removes the electrons from the floating gate 6.

The problem with the prior art planar device is that it is too large in terms of surface area required to make a device which has large coupling between the floating gate and the control gate. A large coupling is required to facilitate programming and erasing at lower voltages. Decreasing the surface area of the memory cell is important because this increases the density of the memory and decreases the cost of manufacturing the memory. The prior art has attempted to solve this problem by building the EEPROM cell in a trench which decreases the surface area of the device. The channel of the device is formed on the bottom of the trench. The sidewalls of the trench form vertical capacitors which increase the area of the floating gate without increasing the surface area of the EEPROM cell itself. The problem with this prior art device is that, although the floating-gate to control-gate capacitance increases, the floating gate to substrate capacitance also increases. This means the coupling between the two capacitors does not substantially increase. The prior art devices are also too slow in programming and erasing because they use hot electron injection from the channel region into the floating gate which consumes a lot of energy so that only few cells can be programmed at a time. Merely building a device in a trench does not address the slow program and erase problem because the device is programmed and erased by an electric field applied to the channel region and floating gate.

The prior art has developed devices which decrease the time needed to program and erase the EEPROM. This has been accomplished through the use of carrier injection techniques which do not depend on injection to the floating gate from the channel region of the EEPROM cell device. In particular, the prior art describes forming a floating gate over a heavily doped drain region wherein the drain region is separated from the floating gate region by a thin dielectric layer. The thin dielectric layer allows tunneling of carriers between the drain region and the floating gate. The tunneling through the drain region both programs and erases the device. The use of this tunneling mechanism helps decrease the program and erase time because Fowler-Nordheim tunneling is a very efficient injection mechanism which allows many cells to be programmed and erased at one time. As a result, the program and erase time for any single cell is reduced. However, the formation of the thin dielectric over the drain region expands the size of the EEPROM cell. In effect, the prior art decreases the program and erase time while increasing the cell size of the EEPROM array which increases the surface area of the memory.

OBJECTS OF THE INVENTION

It is an object of the present invention to manufacture an electrically erasable programmable read only memory (EEPROM).

It is a further object of the present invention to manufacture an EEPROM having reduced surface area.

It is still another object of the present invention to manufacture an EEPROM having reduced surface area and a high coupling ratio.

It is still a further object of the present invention to manufacture an EEPROM having reduced surface area in which the time required to program and erase the EEPROM is also reduced.

It is still another object of the present invention to manufacture an EEPROM having reduced surface area in which the programming or erasing of the EEPROM memory cell through the floating gate is done over a large area of the floating gate.

SUMMARY OF THE INVENTION

The objects of the present invention are accomplished by merging a MOSFET device and a floating gate into a three dimensional trench structure. The trench device cell has four vertical sides and bottom. The bottom of the trench forms the channel region of the transfer FET of the EEPROM cell. The heavily doped source and drain regions are formed on two vertical sidewalls of the trench and oppositely face each other. The heavily doped regions cover the entire sidewall and have a depth which is greater than the trench depth so that the channel region is defined by the bottom of the trench. The remaining two vertical sidewalls of the trench are formed by isolation oxide. A first silicon dioxide layer covers the bottom of the trench and forms part of the gate oxide of the cell device. A second silicon dioxide layer covers the vertical sidewalls of the trench. The second silicon dioxide layer is relatively thin with respect to the gate oxide layer. The second silicon dioxide layer separates the source and drain regions from the floating gate which overlays both the first and second silicon dioxide layers. The floating gate overlaps all four trench sidewalls and substantially increases the coupling between the floating-gate and the control-gate. A control gate overlies the floating gate and the control gate is separated from the floating gate by a separate dielectric layer. The second silicon dioxide layer is relatively thin so that tunneling of electrons between the vertical sidewalls which incorporate the source and drain regions and the floating gate will occur. Tunnelling is the mechanism which charges and discharges the floating gate. The trench EEPROM memory structure of the present invention occupies a small amount of surface area while maintaining a high coupling ratio between the control gate and the floating gate. The high coupling ratio between the floating-gate and the control-gate is maintained because the floating gate is butted to isolation oxide on two sides of the trench. The trench EEPROM memory structure of the present invention also reduces program and erase time because the floating gate can be programmed or charged through either the source or drain regions in many cells at one time.

DESCRIPTION OF THE PREFERRED EMBODIMENT

Figure 1A:
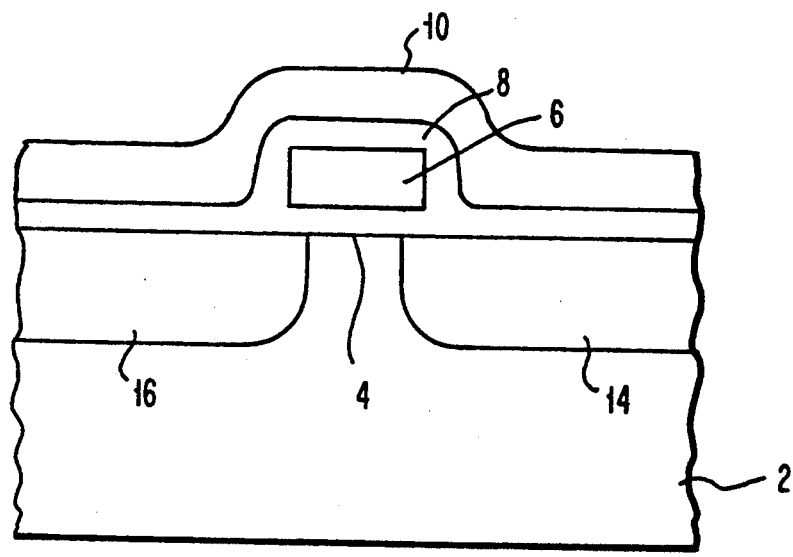
FIGS. 1(a) and 1(b) illustrate a prior art device.
Figure 1B:
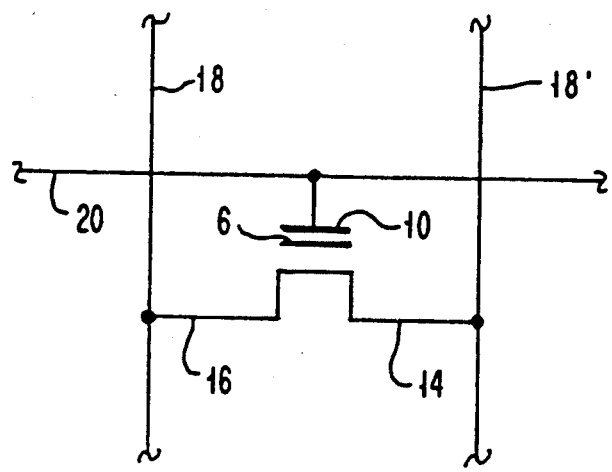
Figure 2:
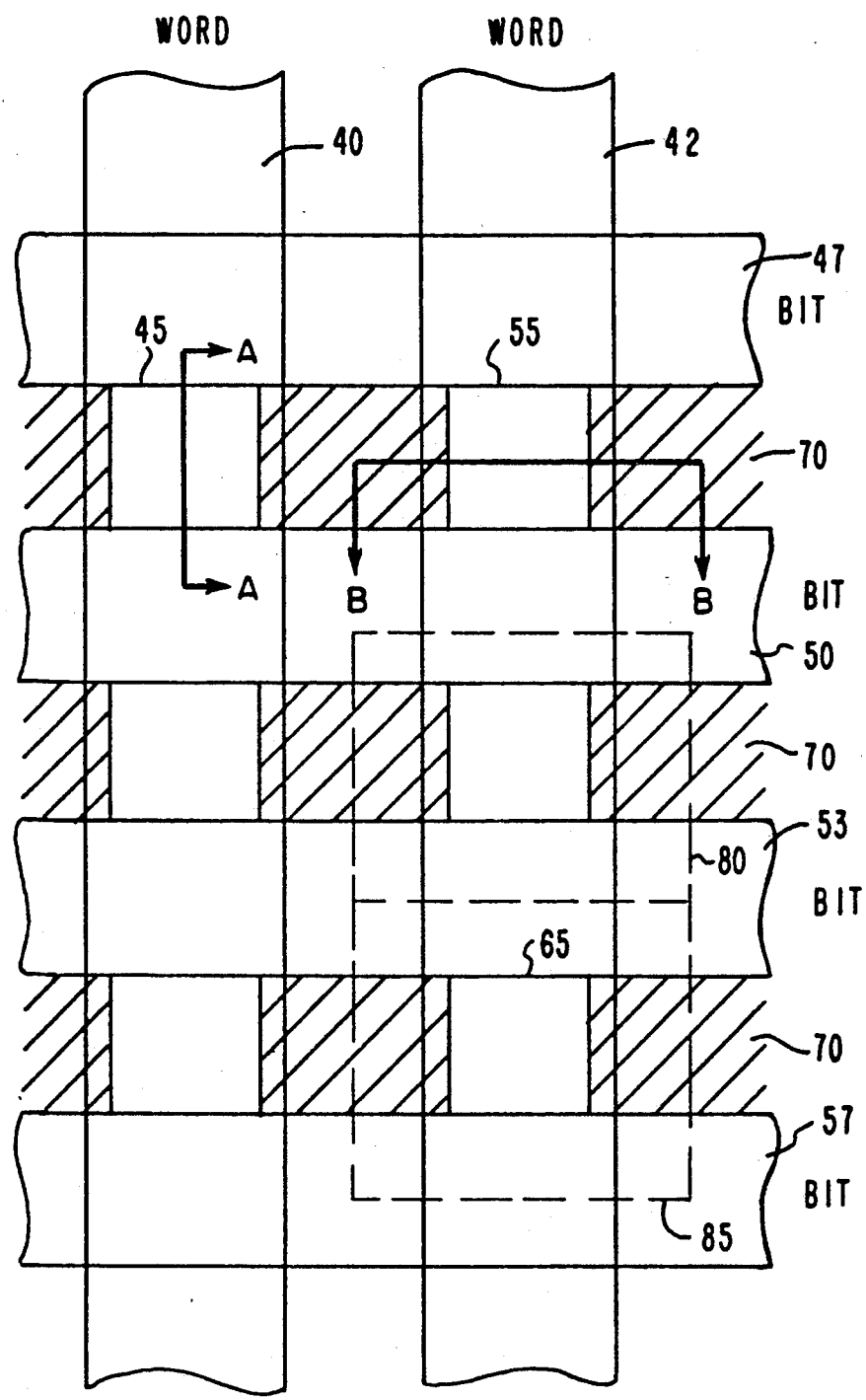
FIG. 2 illustrates the layout of an array according to the present invention.

FIG. 2 illustrates an embodiment of the present invention. FIG. 2 illustrates the layout of an EEPROM array according to the present invention. Word lines 40 and 42 form a grid pattern with bit lines 47, 50, 53 and 57. Bit lines 47, 50, 53, and 57 alternatively function as sources and drains depending on the cell to be addressed. For example, if cell 80 were to be addressed, bit line 50 would be a drain line connected to a high potential and bit line 53 would be a source line connected to a low potential. In contrast, if cell 85 were to be addressed, bit line 53 would be a drain connected to a high potential and bit line 57 would be connected to a low potential. This sharing of bit lines reduces the space required for the cell array. A single cell within the array, such as cell 85, contains a device trench 65, part of word line 42, and part of bit lines 53 and 57. The device trench 65 is adjacent two diffusion regions on two sides of the trench and two isolation regions on the remaining two sides. the word line 42 functions as a control gate to a field effect transistor (FET) which has a channel under trench region 65 and between diffusion regions which form bit lines 53 and 57. The basic structure contained within cell area 85 is replicated in a plurality of rows and columns to form the EEPROM array.

Figure 3:
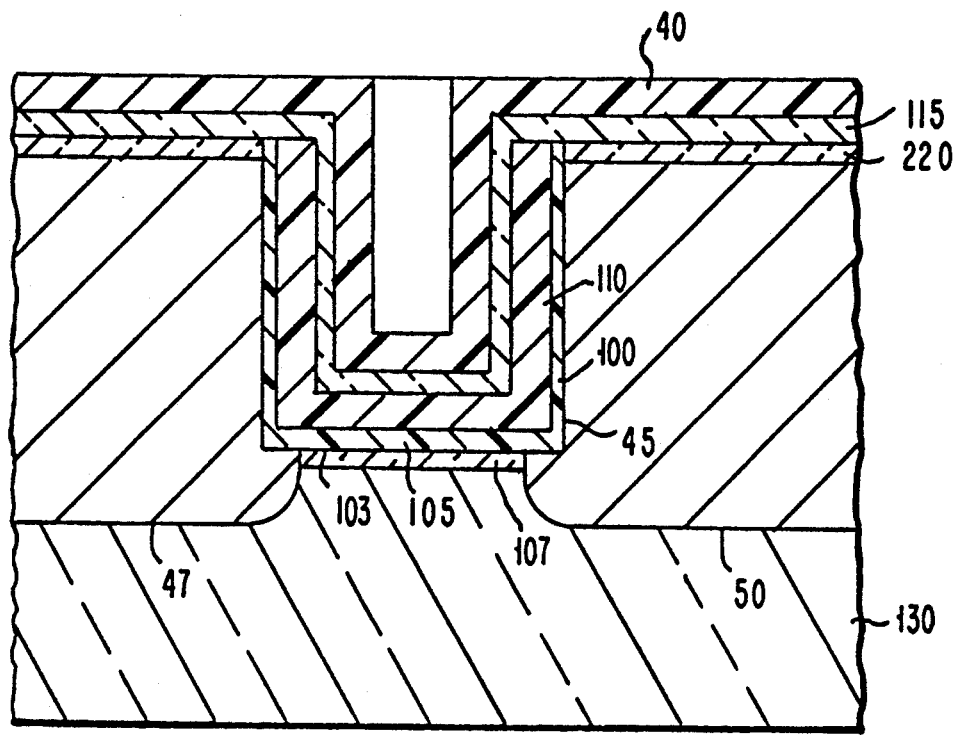
FIG. 3 illustrates the cross section along cut AA of one cell of the present invention.

FIG. 3 illustrates the cross section of device trench 45 along cut AA of FIG. 2. FIG. 3 illustrates that the device trench 45 contains several layers which form the EEPROM cell device. The device trench 45 is interposed between two diffusion regions illustrated as drain region 50 and source region 47. The drain and source regions are heavily doped n-type regions which could also be p-type regions in other embodiments. The bottom of the trench 103 forms a channel region for an FET between the source and drain regions. The channel region 103 is covered by a gate dielectric 105. Gate dielectric 105 is typically a high quality silicon dioxide layer with a thickness of approximately 100 Angstroms (Å). The gate dielectric is covered with a floating gate 110. The floating gate is typically a doped polysilicon layer having a thickness of approximately 100 Å. The floating gate is typically doped n-type at a concentration of $10^{20}/cm^3$ but could also be doped p-type. The floating gate 110 is isolated from the control gate layer 40 by a dielectric layer 115. Layer 115 is a silicon rich oxide layer (SRO) or an ONO (Oxide/Nitride/Oxide) layer. The dielectric 115 layer has a thickness of approximately 150 Å. The control gate 40 is typically a heavily doped polysilicon layer having a thickness of approximately 1000 Å and a doping level of $10^{20}/cm^3$. The control gate could also be metal or another conductor in another embodiment of the present invention.

In addition to forming the channel region, the device trench 45 also forms capacitive areas for the floating gate 110. In order to effectively operate, a high coupling between the floating gate and the control gate is required. This means that the floating gate to control gate capacitance must be much larger than the floating gate to substrate capacitance. Typically the floating gate to control gate is at least three times the floating gate to substrate capacitance but generally the ratio is as large as possible for the minimum surface area used. The area of the capacitance between the control gate and the floating gate is made much larger than the area of the floating gate to the channel region (which is the substrate connection for this capacitance) by using the sidewalls of the device trench to form the control gate to floating gate capacitor. The area of the control gate to floating gate capacitor is increased substantially because all four sides of the trench are used in forming the floating gate to control gate capacitor. FIG. 2 illustrates that the floating gate overlaps the cell trench edges not only on the source and drain edges of the trench but the floating gate also overlaps the two sides of the trench formed by the isolation oxide 70. Overlapping the isolation oxide is important because it increases the floating gate to control gate capacitance without increasing the floating gate to substrate capacitance, and therefore, increases the coupling between floating-gate and the control-gate. The floating gate is disposed over the gate dielectric 105 on the bottom of the trench and it is disposed over a sidewall dielectric 100 on the trench sidewall.

Figure 4:
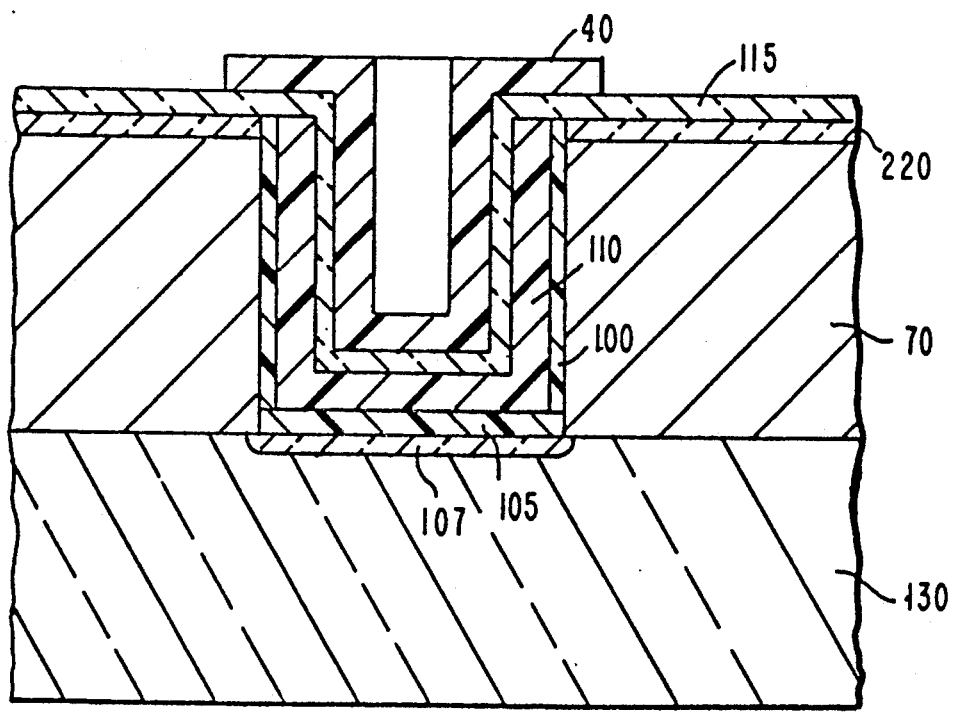
FIG. 4 illustrates the cross section along cut BB of one cell of the present invention.

FIG. 4 illustrates a cross section of the device trench 55 along cut BB of FIG. 2. The sidewall dielectric 100 is a separate and distinct layer from the gate dielectric 105 which has a different thickness and performs a different function. The sidewall dielectric 100 shown in FIGS. 3 and 4 is approximately 70 Å thick and is used as a tunneling dielectric which facilitates programming and erasing the floating gate 110. The sidewall dielectric must be thin enough to allow tunneling at the applied operating voltages and thick enough to isolate the floating-gate from the trench sidewall. A preferred sidewall dielectric thickness range is from 50 to 150 Å, although this range can be larger. In contrast, the gate dielectric 105 is approximately 100 Å thick and facilitates sensing the charge stored in the floating gate. The gate dielectric must be thick enough to avoid tunneling, but thin enough to operate the MOSFET well. The trench shown in FIG. 4 is approximately 5000 Å deep and is as deep as the isolation oxide 70. The silicon layer 130 has a doping concentration of approximately $2 \times 10^{16}/cm^3$. The doping concentration of the channel region 107 is different than the silicon substrate and is approximately $1 \times 10^{17}/cm^3$. As in FIG. 3, the gate and sidewall dielectrics are covered by the floating gate 110 which is in turn covered by another dielectric layer 115. Dielectric layer 115 is interposed between the floating gate 110 and the control gate 40.

FIGS. 5-11 illustrate the formation of the structures shown in FIGS. 2-4. FIG. 5(a) illustrates a cross section of the memory cell device at an intermediate stage in the processing of the device. A silicon substrate 130 having a uniform doping concentration of $2 \times 10^{16}/cm^3$ has layers 220, 215, and 210 deposited over the silicon substrate. Layer 220 is formed of silicon nitride and is approximately 400 Å thick. Layer 215 is formed of silicon dioxide and is approximately 400 Å thick. Layer 220 is formed of silicon nitride and is approximately 1,000 Å thick. A layer of photoresist is deposited over layer 210 and developed to form a pattern for trench formation. A trench is etched into the silicon substrate wherever no photoresist remains after development. The trenches are formed as a series of long rectangular shapes disposed parallel to each other. The trenches are etched into the silicon substrate to a depth of approximately 5,000 Å using a reactive ion etching (RIE) process. The depth of the trench could range from approximately 1,000 Angstroms to a micron or more. The depth depends on the cell capacitance required as explained below. The photolithography and trench etching processes are conventional processes which are well known in the art.

Figure 5A:
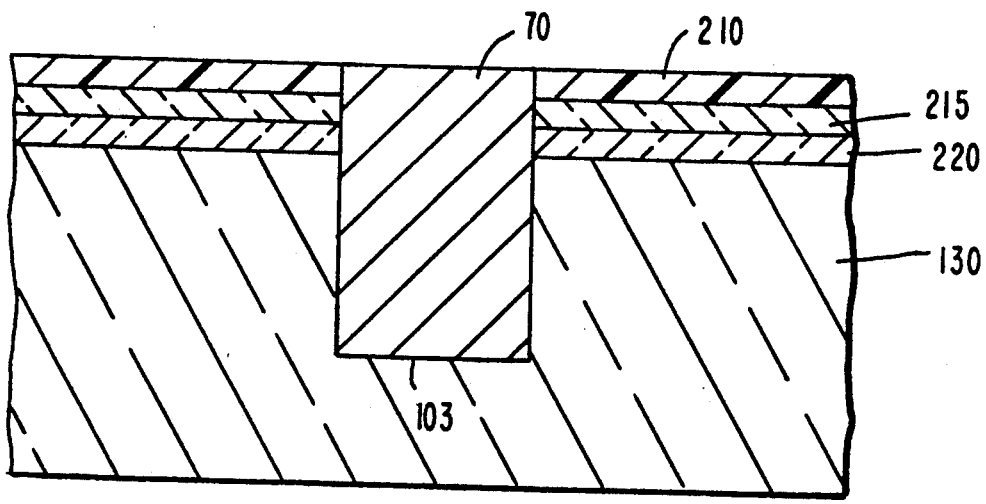
FIGS. 5(a) and 5(b) illustrate the present invention at an intermediate stage in the fabrication of the device.
Figure 5B:
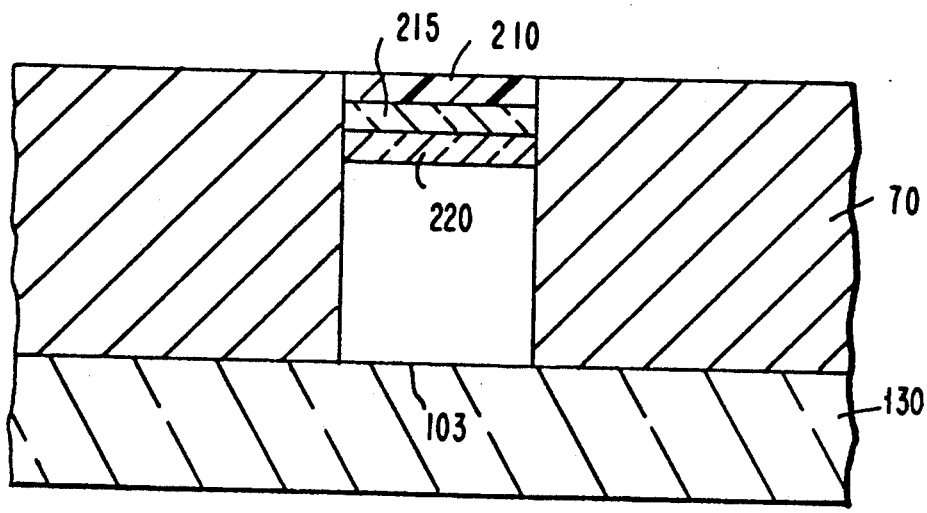
Figure 6:
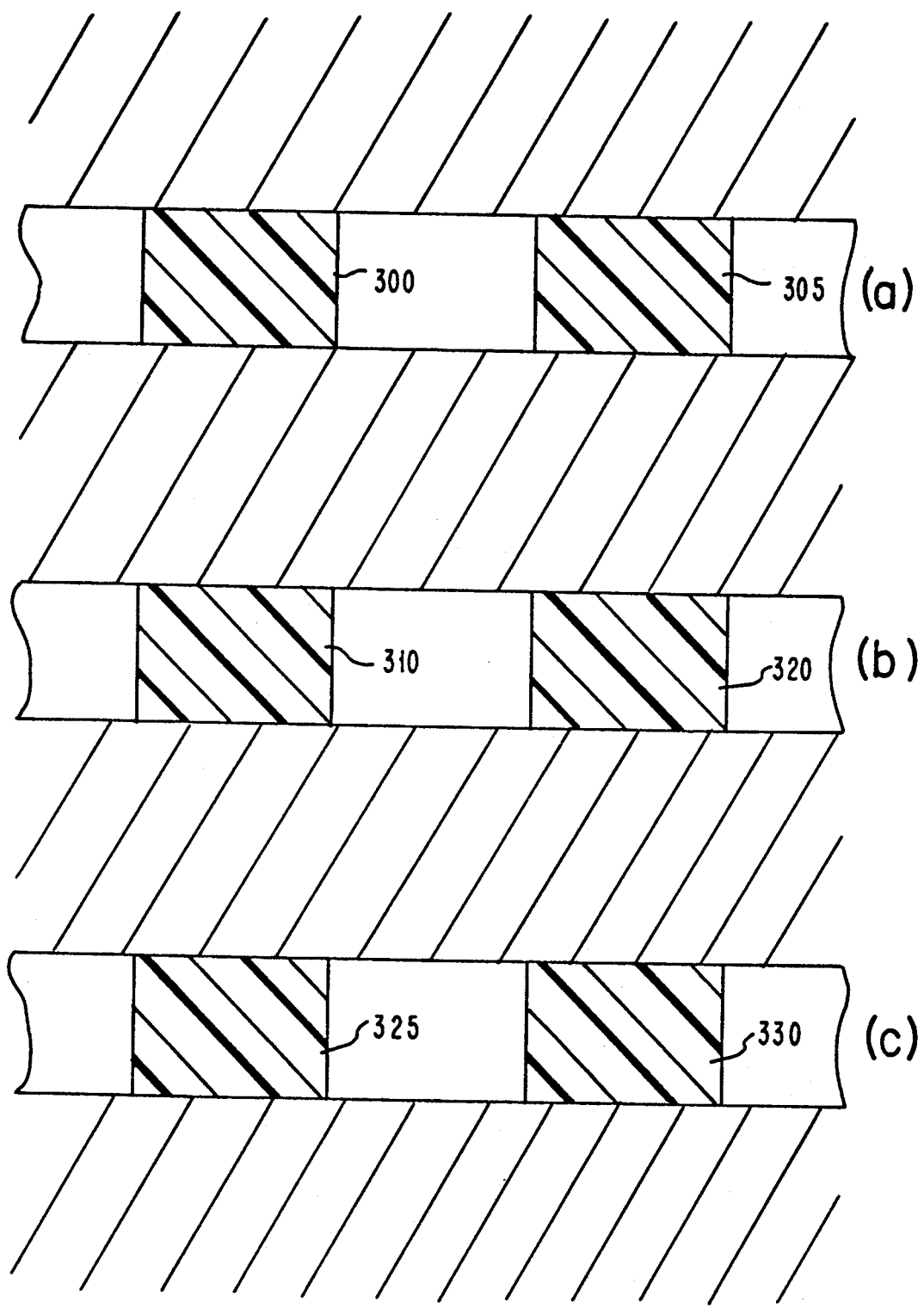
FIGS. 6(a)-6(c) illustrate protected areas of isolation oxide in the trench of the present invention.

Once the trenches are etched, a conformal layer of isolation oxide is deposited. This layer of silicon dioxide is formed with a chemical vapor deposition (CVD) process commonly known and used in the art. In particular, the oxide is deposited at 400° C. with 100% $SiH_4$ of 95 ccm and an $O_2$ flow of 110 ccm. The pressure in the process is approximately 190 mTorr and the deposition rate is approximately 7 nm/minute. Photoresist is again deposited and developed, after the oxide deposition, and the isolation oxide is then etched in a series of rectangular shapes. FIG. 6 illustrates that oxide is left in parts of the trenches. The photoresist covers areas 300 and 305 of trench (a), 310 and 320 of trench (b), and 325 and 330 of trench (c). The oxide is etched by a RIE process until the thickness of oxide filling the trench, typically 5,000 Å, has been etched. The RIE is performed at 40 mTorr pressure, 1400 Watts, in $CHF_3$. The RIE etch stops on nitride layer 210 outside the trench areas so the surface of the substrate is not damaged which would impede later processing. The areas outside areas 300, 305, 310, 315, 320, 325, and 330 and inside the trench are the device trenches in which the capacitor structure of the present invention is built. FIG. 5(a) illustrates the resulting structure along cut AA of device trench 45 in FIG. 2. FIG. 5(b) illustrates the resulting structure along cut BB of device trench 55 in FIG. 2.

Figure 7:
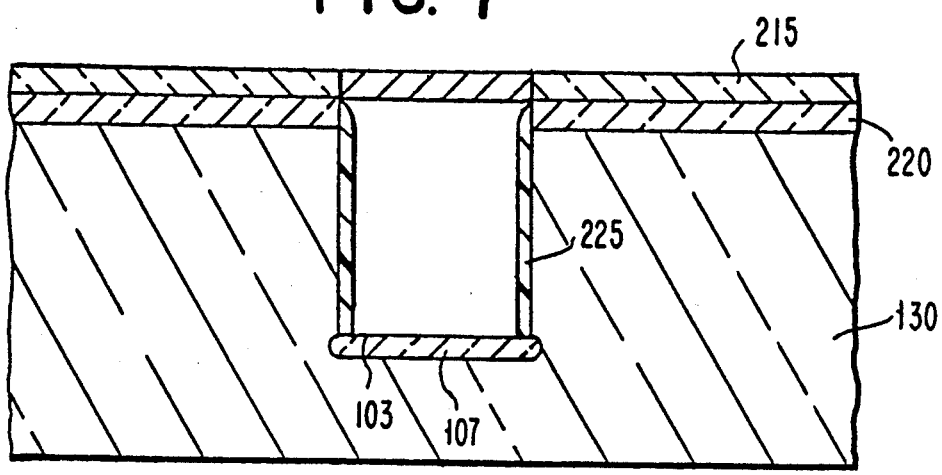
FIG. 7 illustrates a cross section along cut AA of the present invention after the trench sidewall nitride is formed.

Once the device trench has been formed, a silicon nitride sidewall layer 225 is formed on the trench sidewalls. This layer is formed by depositing approximately 400 Å of silicon nitride conformally to entire surface of the structure shown in FIG. 5(a). This uniform thickness layer is then etched off in an RIE etch. The silicon nitride etch selectively etches nitride without etching oxide. In addition, the RIE process does not etch the nitride on the vertical sidewalls of the trench because RIE processes are anisotropic. As a result, the RIE process etches off the nitride layers 210 and 225 from the horizontal surfaces of the memory structure and leaves the nitride layer 225 on the vertical surfaces of the device trenches. The bottom surface of the trench 103 is exposed silicon and is the channel region for the trench device. A blanket implant is performed at this stage to adjust the threshold voltage of the trench device. The implant species is boron which is implanted at 20 KeV with a dose of $2\times10^{12}/cm^2$. FIG. 7 illustrates the resulting structure.

Figure 8:
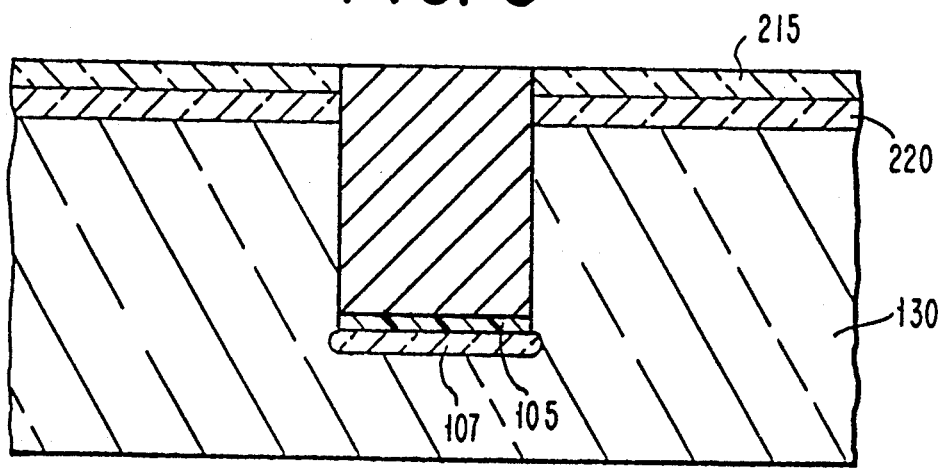
FIG. 8 illustrates a cross section along cut AA of the present invention after the gate oxide is formed.
Figure 9:
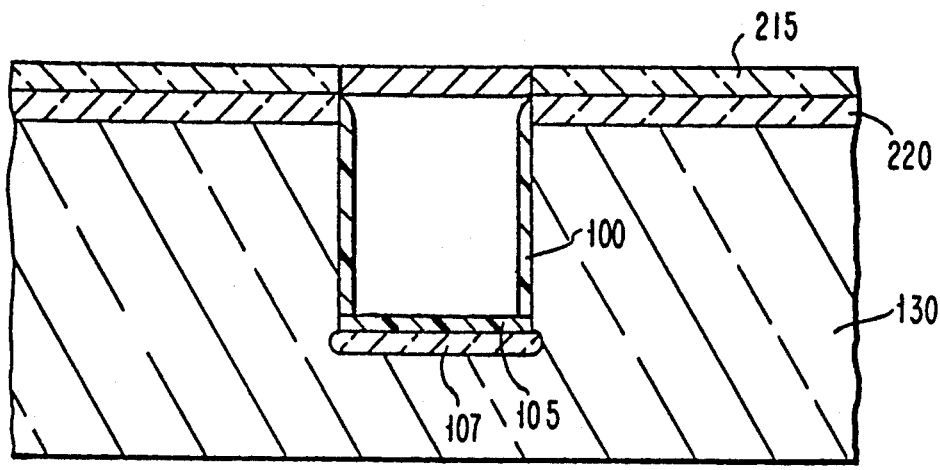
FIG. 9 illustrates a cross section along cut AA of the present invention after the trench sidewall oxide layer is formed.

FIGS. 8 and 9 illustrate the formation of the gate and trench sidewall oxides. After the channel ion implant, the gate oxide 105 can be grown. The gate oxide is a high quality thermal oxide which is formed on the bottom of the trench. The thickness of the gate oxide is approximately 70 Å as initially grown. The trench sidewall nitride layer 225 not only protects the sidewall of the trench from the channel ion implant but also does not allow the formation of oxide on the trench sidewall during the gate oxide formation step. This is important because the gate oxide must be optimized independently from a later sidewall oxide. The use of the nitride layer 225 allows the gate oxide 105 to be formed separately from the sidewall oxide and so the two layers can have different thickness's. Once the gate oxide is formed, the sidewall nitride layer 225 is stripped in a wet etch bath which is typically phosphoric acid. The wet etch etches the nitride layer but does not etch the silicon or silicon dioxide. FIG. 8 illustrates the gate oxide growth and sidewall nitride strip. Once the sidewall nitride has been stripped, the trench sidewalls are exposed silicon. A sidewall oxide 100 is grown on the trench sidewalls. The thickness of the sidewall oxide 100 is grown to approximately 70 Å. The growth of the sidewall oxide increases the oxide formation of the gate oxide 105. The final gate oxide thickness is approximately 100 Å after the trench sidewall thermal oxide growth. The gate oxide thickness of 100 Å is a result of 70 Å of initial oxide, approximately 40 Å stripped away in the nitride stripping process, and 70 Å grown for the trench sidewall oxide which also adds to the gate oxide. FIG. 9 illustrates the resulting structure after the trench sidewall oxide growth.

Figure 10:
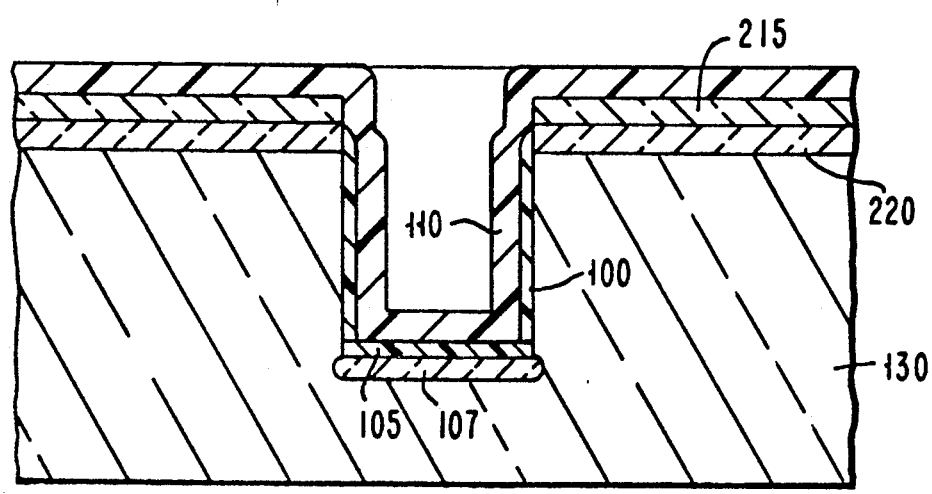
FIG. 10 illustrates a cross section along cut AA of the present invention after the floating gate film has been deposited.
Figure 11:
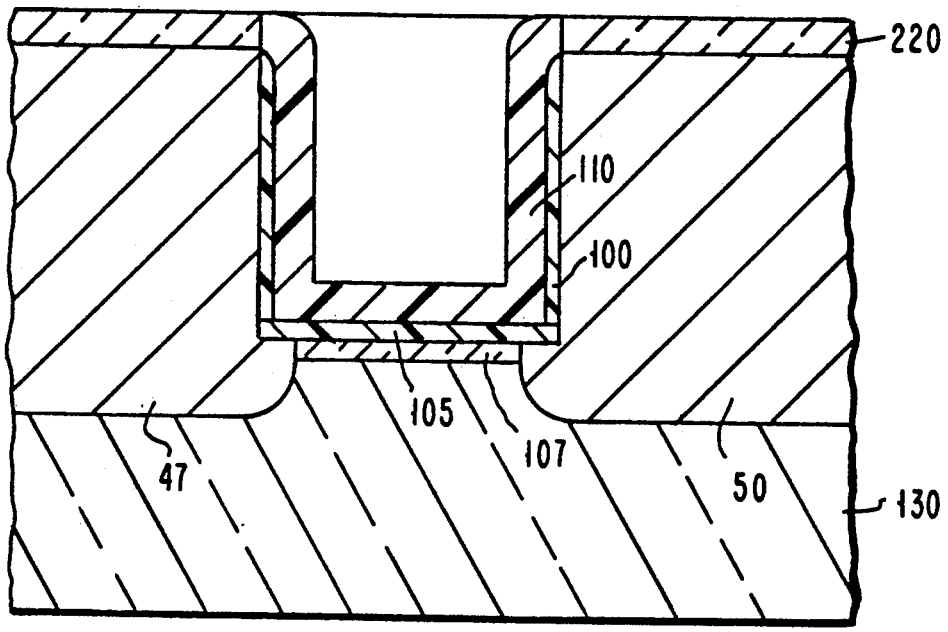
FIG. 11 illustrates a cross section along cut AA of the present invention after the floating gate film has been polished.

FIGS. 10 and 11 illustrate the formation of the floating gate. FIG. 10 illustrates that once the sidewall oxide layer 100 is formed, a conformal layer of polysilicon 110 is deposited over the memory cell device as shown in FIG. 10. The polysilicon layer is later doped n-type to approximately $1\times10^{20}/cm^3$ or more and is approximately 1,000 Å thick. As deposited, the polysilicon layer overlaps both the silicon and the oxide trench sidewalls. After the polysilicon layer is deposited, the polysilicon is etched by a chemical and mechanical polishing process. The polishing process rotates the surface of the polysilicon on an abrasive pad using a slurry at 20 RPM and 10 PSI. The polishing grinds off the horizontal surface polysilicon and oxide layers, 110 and 215 respectively. The polishing does not grind off the nitride pad 220 because the etch rate of nitride by this process is very low. The polishing process confines the floating gate to the trench. Any conventional polysilicon planarization process which is selective to the nitride pad is suitable for this process etch step. The polishing process does not require a photolithography step and so the floating gate is self aligned. The structure after polishing is shown in FIG. 11. Additionally, the source and drain implants to the trench device are self aligned because the floating gate performs a masking function to a blanket source/drain implant. The source and drain are ion implanted with an arsenic species at 45 Kev, a dose of $1\times10^{15}/cm^2$, and a drive-in of 45 minutes at 900° C. The floating gate is doped with this implant and it protects the channel region at the bottom of the trench from the implant without a separate mask. The arsenic is implanted through 400 Å of nitride into the silicon and the source and drain are formed on either side of the trench. The source and drain are deeper than the trench bottom so that the trench bottom 103 forms the channel between the source and drain regions. The dopant does not outdiffuse from the polysilicon into the channel region because of the gate oxide between the polysilicon floating gate and the silicon channel region.

Figure 12:
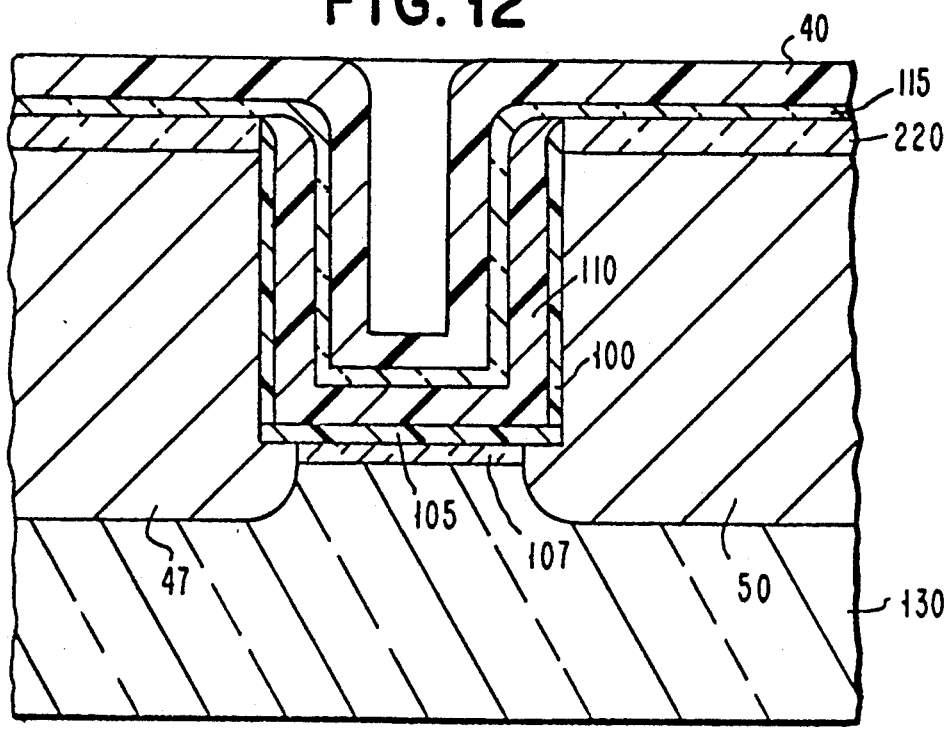
FIG. 12 illustrates a cross section along cut AA of the present invention after the control gate film has been deposited.

FIG. 12 illustrates the formation of the control gate 40. After the source and drain regions have been formed, a dielectric layer 115 is deposited which separates the floating gate 110 from a subsequently deposited control gate 40. The dielectric layer 115 can be either a silicon dioxide/silicon nitride/silicon dioxide (ONO) multilayer structure or an silicon rich oxide layer (SRO). The SRO layer is a $Si_xO_2$ layer in which x is greater than 1. The dielectric layer 115 is approximately 125 Å thick. The SRO layer is a very good insulator on polysilicon. The thickness of the dielectric layer is chosen to be thick enough so that significant tunneling of electrons between the floating gate and the control gate does not occur. Significant tunnelling between the floating gate and the control gate would degrade the data retention time of the EEPROM. The thickness of the dielectric layer must also be thin enough to provide a larger capacitance for the floating gate to control gate capacitor than the capacitance of the floating gate to substrate capacitor which improves the coupling of the memory cell. After the blanket deposition of the dielectric layer 115, the control gate 40 is deposited. The control gate is a heavily doped (for example $1\times10^{20}/cm^3$ or more) N or P type layer of polysilicon. The control gate could also be a metallic or silicide conductor. The control gate is deposited as a blanket layer of polysilicon which is approximately 1,000 Å thick. Photoresist is applied and developed over the blanket polysilicon layer to form the pattern of the control gate. The blanket polysilicon is then etched in a RIE process to form the control gate. The RIE process etches through the polysilicon and the dielectric layer 115 and stops on the underlying nitride layer 220.

The final structure of the EEPROM memory cell is illustrated in FIG. 12. The operation of the memory cell device is dependant upon using the bottom of the trench as the channel region, the four sidewalls of the trench as capacitive are for the floating gate, and the two sidewalls of the trench abutting the source and drain regions as charging and discharging regions for the floating gate. The surface area of the EEPROM cell is reduced because the transfer device of the memory cell and the capacitor of the floating gate are merged in a three dimensional trench structure. Coupling is increased in this structure because the floating gate overlaps isolation oxide on two trench sidewalls which adds capacitance to the floating gate to control gate capacitor without adding capacitance to the floating gate to substrate capacitor and this increases coupling between the two capacitors. This increase in coupling lowers the voltage necessary to write or erase the floating gate. The write and erase time of the memory cell is also decreased because the source and drain regions abutting the trench sidewall can be used separately or in combination to charge or discharge the floating gate. More specifically, charge carriers (electrons or holes) can be transferred between the source or drain and the floating gate through a tunnelling mechanism because the sidewall dielectric is relatively thin. Tunnelling is confined to the sidewall and does not occur in the channel region because the sidewall dielectric is thinner than the gate dielectric.

In order to write data into the EEPROM, a voltage is applied to the control gate which is high enough to cause a tunnelling current into the floating gate which charges the floating gate. The voltage applied to the wordline of this EEPROM (and therefore to the control gate) is approximately 8 volts. The voltage applied to the bit lines determines which side of the FET tunnelling current comes from. When 8 volts is on the control gate and 0 volts is applied on the bit line, that bit line supplies tunnelling current into the floating gate. In this EEPROM, either bit line can be placed at 0 volts so that current tunnels into the floating gate from both the source and the drain. The ability to charge the floating gate from both the source and the drain increases the speed that the memory cell can store data. The voltage on the control gate must be left on for approximately 0.1 milliseconds. However, because the tunnelling current is coming directly from the source/drain regions, a large number of cells (approximately 10,000) can be written to at one time without significantly increasing the power used to write. This is in contrast to prior art EEPROMs which charge the floating gate using hot carrier injection so that they can only write to a relatively small number of cells without significantly increasing power consumption.

When only a single bit line is attached to 0 volts while the gate is at approximately 8 volts and the remaining bit line is at an intermediate voltage of approximately 2 volts, the floating gate is still charged by the tunnelling current from one bit line. This charging method takes more time than charging from both the source and drain of the cell FET device. When data is to be read out of the memory cell, the wordline is brought up to approximately 3 volts, one bit line (either the source or drain) is connected to approximately 0 volts, and a second bit line (either the drain or the source) is connected to approximately 3.0 volts. When data is to be erased from a memory cell, approximately 0 volts is applied to the wordline and approximately 8 volts is applied to one or both bit lines to tunnel current out of the floating gate. The voltages applied above refer to an N channel FET, when this device is built with a P channel, the polarity of the voltages is reversed. For example, 8 volts on the wordline of an N channel device becomes −8 volts in a P channel device.

The carriers are transferred to the floating gate because of a tunneling mechanism which requires a relatively thin dielectric in order for carriers to easily tunnel through. In the present invention, the sidewall dielectric is approximately 70 Å thick. The thickness of this sidewall dielectric could range between approximately 50 and 150 Å. The tunnelling dielectric is generally silicon dioxide but could also be SRO. The more tunneling that occurs, the faster the floating gate charges and discharges. Additionally, tunneling can occur between the source or drain and the floating gate. This is because the thickness of the sidewall oxide is smaller than the thickness of the gate oxide which results in tunnelling occurring over the source and drain diffusions rather than in the FET channel. This is important because the transfer FET device is not degraded by the write and erase operations. Moreover, in prior art EEPROM devices, only one side of the FET (either the source or drain but not both) was used as the tunneling region. As a result, the transfer FET of the cell had to conduct on either the charge or discharge operation (depending on the voltages connected to the source and drain). In the present invention however, when the transfer FET of the memory cell does not conduct, both the source and the drain have independent access to the floating gate through the tunnelling mechanism. The present invention not only uses very little surface area because of its three dimensional structure but it is also very fast in charging and erasing the floating gate because of the two tunnelling regions associated with the source and drain of the transfer device of the memory cell.

Figure 13A:
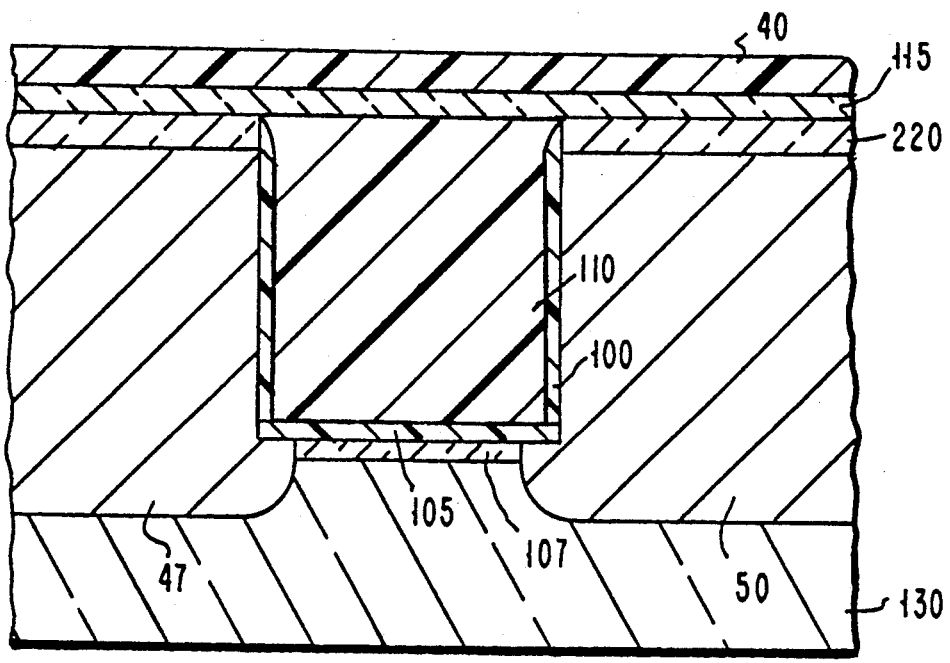
FIGS. 13(a)-13(b) illustrate an alternate embodiment of the present invention.
Figure 13B:
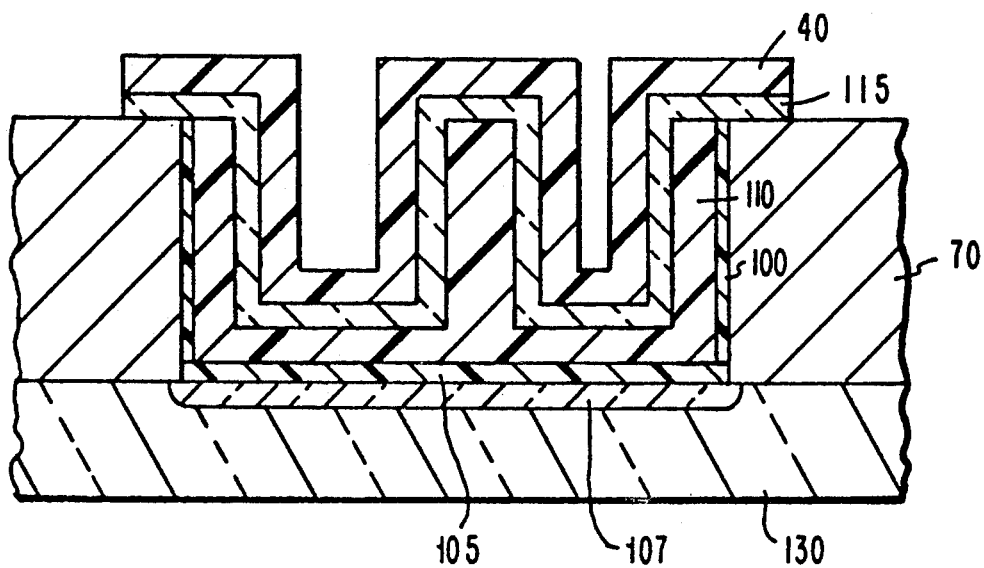

FIG. 13 illustrates an alternate embodiment of the present invention. FIG. 13(a) illustrates a cross section along cut AA of FIG. 2. FIG. 13(b) illustrates a cross section along cut BB of FIG. 2. FIGS. 13 (a) and (b) illustrate that the floating gate 110 is not merely a conformal layer of polysilicon. Instead, the floating gate and the control gate are interleaved such that the effective area of the control to floating gate capacitor is increased without increasing the surface area of the memory cell. The floating gate has two sides, the first side contacts the gate and sidewall dielectrics and conforms to the surface of the gate and sidewall dielectrics. The second side is patterned and formed into at least one generally vertical column-like projection from the surface of the gate oxide. The dielectric layer 115 and the control gate cover these column-like projections of the floating gate and so are interleaved between the column-like projections. The column-like projection can be formed in a variety of geometric shapes such as triangular, rectangular, hexagonal, pentagonal, or irregularly shaped columns.

The control gate and floating gate are formed in the second embodiment by filling trench area with polysilicon after the trench sidewall oxide layers 100 are formed as in the first embodiment. The same polishing step as in the first preferred embodiment is then carried out to planarize the polysilicon layer 110 with the nitride layer 220. A photolitography step is then carried out to pattern areas in the polysilicon layer 110. The patterned areas are then etched to form trenches in the polysilicon layer. The trenches in the polysilicon layer must not be deep enough to contact the gate oxide 105. The trenches create generally planar surfaces which define the column-like projections of floating gate material. Once the trenches are formed, then the dielectric layer 115 and the control gate 40 are deposited and patterned in the same manner as the preferred embodiment. This alternate embodiment still has the floating gate 110 charged and discharged through the trench sidewall dielectric layer 100. The polysilicon is a single conductive layer which is not etched away from the trench to sidewall layer interface. As a result, the entire floating gate is still charged through the two trench sidewall layers 100. Further, because of the increase in floating gate to control gate capacitance, the coupling of the cell is increased as the floating gate to control gate capacitor gets larger with respect to the floating gate to substrate capacitor.

While the invention has been described and illustrated with respect to plural embodiments thereof, it will be understood by those skilled in the art that various changes in the detail may be made therein without departing from the spirit, scope, and teaching of the invention. Therefore, the invention disclosed herein is to be limited only as specified in the following claims.

Having thus described our invention what we claim as new and desire to secure as Letters Patent, is:

1. A semiconductor device, comprising:
   a semiconductor substrate having a major surface, first and second sidewall surfaces, and a channel region;
   said first sidewall surface forming a trench in said substrate with said second sidewall surface and said channel region, said first sidewall surface being separated from said second sidewall surface by said channel region, said channel region forming a bottom surface of said trench, said first and second sidewall surfaces being generally orthogonal with respect to said substrate major surface;
   isolation material partially filling said trench and forming a first isolation sidewall and a second isolation sidewall in said trench;
   said first and second sidewall surfaces being doped with a first type of dopant;
   a first dielectric layer overlaying said first and second sidewall surfaces;
   a floating gate;
   a second dielectric layer interposed between said channel region and said floating gate, said floating gate covering said second dielectric layer, said first dielectric layer, and said isolation sidewalls;
   a control gate layer;
   a third dielectric layer interposed between said floating gate layer and said control gate layer, said control gate layer covering said third dielectric layer at least at regions where said third dielectric layer covers said floating gate.

2. The semiconductor device, as in claim 1 wherein: said first dielectric layer extends to regions where it overlays said first and second isolation sidewalls, and is interposed between said floating gate and said isolation sidewalls at said regions.

3. A semiconductor device, as in claim 1, wherein:
   said first dielectric layer has a thickness less than said second dielectric layer; and
   said first dielectric layer has a thickness of less than approximately 150 Å;

4. A semiconductor device, as in claim 2, wherein:
   said first dielectric layer has a thickness less than said second dielectric layer; and
   said first dielectric layer has a thickness of less than approximately 150 Å;

5. A semiconductor device, as in claim 3, wherein:
   said first type of dopant is N-type.

6. A semiconductor device, as in claim 3, wherein:
   said first type of dopant is P-type.

7. A semiconductor device, as in claim 4, wherein:
   said first type of dopant in N-type.

8. A semiconductor device, as in claim 4, wherein:
   said first type of dopant is P-type.

9. A semiconductor device, as in claim 5, wherein:
   said floating gate has an interface side and a patterned side, said interface side contacts said first and second dielectric layers, said patterned said has at least two generally planar surfaces for increasing the capacitance between said floating gate and said control gate.

10. A semiconductor device, as in claim 6, wherein:
    said floating gate has an interface side and a patterned side, said interface side contacts said first and second dielectric layers, said patterned side has at least two generally planar surfaces for increasing the capacitance between said floating gate and said control gate.

11. A semiconductor device, as in claim 7, wherein:
    said floating gate has an interface side and a patterned side, said interface side contacts said first and second dielectric layers, said patterned side has at least two generally planar surfaces for increasing the capacitance between said floating gate and said control gate.

12. A semiconductor device, as in claim 8, wherein:
    said floating gate has an interface side and a patterned side, said interface side contacts said first and second dielectric layers, said patterned side has at least two generally planar surfaces for increasing the capacitance between said floating gate and said control gate.

* * * * *